United States Patent
Luo

(10) Patent No.: US 10,001,249 B2
(45) Date of Patent: Jun. 19, 2018

(54) SHELL INTEGRATED LIGHT-EMITTING DIODE ASSEMBLY, SHELL INTEGRATED LIGHT-EMITTING DIODE LAMP, AND MANUFACTURING METHOD THEREOF

(71) Applicant: Guan-Jie Luo, Taiwan (TW)

(72) Inventor: Guan-Jie Luo, Taiwan (TW)

( * ) Notice: Subject to any disclaimer, the term of this patent is extended or adjusted under 35 U.S.C. 154(b) by 0 days. days.

(21) Appl. No.: 15/299,485

(22) Filed: Oct. 21, 2016

(65) Prior Publication Data
US 2017/0159889 A1 Jun. 8, 2017

(30) Foreign Application Priority Data

Dec. 2, 2015 (TW) .............................. 104140338 A

(51) Int. Cl.
| | |
|---|---|
| *H01L 33/64* | (2010.01) |
| *F21K 9/232* | (2016.01) |
| *F21V 29/85* | (2015.01) |
| *F21K 9/238* | (2016.01) |
| *F21K 9/235* | (2016.01) |

(Continued)

(52) U.S. Cl.
CPC .............. *F21K 9/232* (2016.08); *B29C 39/12* (2013.01); *B29C 39/26* (2013.01); *C08K 3/013* (2018.01); *C09K 11/02* (2013.01); *C09K 11/08* (2013.01); *F21K 9/235* (2016.08); *F21K 9/238* (2016.08); *F21K 9/64* (2016.08); *F21K 9/90* (2013.01); *F21V 3/02* (2013.01); *F21V 9/30* (2018.02); *F21V 23/001* (2013.01); *F21V 23/003* (2013.01); *F21V 23/06* (2013.01); *F21V 29/85* (2015.01); *H01L 33/501* (2013.01); *H01L 33/502* (2013.01); *H01L 33/54* (2013.01); *H01L 33/62* (2013.01); *H01L 33/641* (2013.01); *B29K 2863/00* (2013.01); *B29K 2995/0013* (2013.01); *B29K 2995/0035* (2013.01); *B29L 2031/34* (2013.01); *C08K 2201/001* (2013.01); *F21V 3/062* (2018.02); *F21V 3/08* (2018.02); *F21V 19/0045* (2013.01); *F21V 29/506* (2015.01);
(Continued)

(58) Field of Classification Search
CPC H01L 33/52–33/56; F21K 9/232; F21K 9/66; F21V 19/0015–19/0025; F21V 3/0436
See application file for complete search history.

(56) References Cited

U.S. PATENT DOCUMENTS

| | | | | |
|---|---|---|---|---|
| 6,518,600 B1 * | 2/2003 | Shaddock | ............... | H01L 33/56 257/100 |
| 7,401,945 B2 * | 7/2008 | Zhang | ................... | F21K 9/232 362/240 |

(Continued)

*Primary Examiner* — Mariceli Santiago
(74) *Attorney, Agent, or Firm* — Anna Tsang

(57) ABSTRACT

The invention provides a shell integrated light-emitting diode assembly, which includes: a plurality of light-emitting units, each of the light-emitting units including at least one light-emitting chip and an external wiring which is coupled to the light-emitting chip; and a shell structure, formed as a consolidation structure by a molding material for enclosing the light-emitting units to be inside the molding material; wherein the light-emitting units emit light through the molding material into an outside of the shell structure. The present invention also provides a shell integrated light-emitting diode lamp with the shell integrated light-emitting diode assembly, and a manufacturing method for the shell integrated light-emitting diode assembly.

19 Claims, 7 Drawing Sheets

(51) Int. Cl.
*B29C 39/12* (2006.01)
*B29C 39/26* (2006.01)
*C09K 11/02* (2006.01)
*C09K 11/08* (2006.01)
*F21V 3/02* (2006.01)
*F21V 23/00* (2015.01)
*F21V 23/06* (2006.01)
*H01L 33/50* (2010.01)
*H01L 33/54* (2010.01)
*H01L 33/62* (2010.01)
*F21K 9/90* (2016.01)
*F21K 9/64* (2016.01)
*F21Y 115/10* (2016.01)
*B29L 31/34* (2006.01)
*F21V 19/00* (2006.01)
*H01L 25/075* (2006.01)
*H01L 33/48* (2010.01)
*F21V 29/506* (2015.01)

(52) U.S. Cl.
CPC ....... *F21Y 2115/10* (2016.08); *H01L 25/0753* (2013.01); *H01L 33/483* (2013.01)

(56) References Cited

U.S. PATENT DOCUMENTS

| | | | |
|---|---|---|---|
| 8,789,974 B2* | 7/2014 | Watanabe | F21K 9/232 361/273 |
| 8,931,924 B2* | 1/2015 | Lin | F21V 29/2293 362/249.02 |
| 9,062,875 B2* | 6/2015 | Neal | F21K 9/20 |
| 9,746,143 B2* | 8/2017 | Osburn | F21K 9/232 |
| 2003/0090910 A1* | 5/2003 | Chen | F21K 9/232 362/555 |
| 2007/0291482 A1* | 12/2007 | Baroky | F21K 9/232 362/227 |
| 2011/0156584 A1* | 6/2011 | Kim | F21K 9/00 315/32 |
| 2014/0240990 A1* | 8/2014 | Bae | F21K 9/232 362/294 |
| 2015/0308628 A1* | 10/2015 | Athalye | F21K 9/232 362/650 |
| 2016/0003417 A1* | 1/2016 | Bukkems | F21K 9/232 362/236 |

* cited by examiner

SHELL INTEGRATED LIGHT-EMITTING DIODE ASSEMBLY, SHELL INTEGRATED LIGHT-EMITTING DIODE LAMP, AND MANUFACTURING METHOD THEREOF

CROSS REFERENCE

The present invention claims priority to Taiwan Patent Application TW 104140338, filed on Dec. 2, 2015.

BACKGROUND OF THE INVENTION

Field of Invention

The present invention relates to a shell integrated light-emitting diode assembly, in particular a shell integrated light-emitting diode assembly capable of emitting light and heat radiation in all directions (for example, 360 degrees), which is formed as a consolidation structure by a molding material for enclosing a plurality of white light-emitting units inside the molding material, to be an integration structure. In this integration structure, the shell structure functions as the white light-emitting unit, and the white light-emitting units also function as the shell structure. That is, the present integration structure plays both functions of the shell structure and the white light-emitting units simultaneously.

Description of Related Art

Light-emitting devices become a development focus due to their advantages such as higher lighting efficiency and longer life time over conventional halogen lights (or conventional incandescent lights). A conventional LED chip encapsulation is encapsulating a LED chip on an aluminum substrate, PCB, or ceramic substrate according to chip on board (COB) technique. This kind of conventional LED chip encapsulation has only single side light emission, resulting in lower lighting efficiency. Another conventional LED chip encapsulation is encapsulating a LED chip on glass substrate by chip on glass technique, whereby the lighting efficiency is raised. However, the glass substrate has drawbacks of poor heat dissipation efficiency, low yield rate, and various light color temperatures of the emitted light at two sides of the glass substrate. Therefore, the conventional LED chip encapsulations are still needed for improvement.

FIG. 1 shows a conventional LED lamp 10, which includes a LED chip 11 by the conventional encapsulation technique, and a lamp housing 12, wherein a room space 121 is set between the LED chip 11 and the lamp housing 12. The room space 121 is empty except some specific kind of air or gas therein. The light is emitted from the LED chip 11 through the room space 121 and the lamp housing 12, to an outside of the conventional LED lamp 10. This long light path results in a low light extraction rate of the lamp housing 12. Further, the long light path through the room space 121 and the lamp housing 12, causes a poor heat dissipation from the LED chip 11 to the outside of the LED lamp 10, since the air or gas is not a good heat dissipation material. Usually, one thermal radiator (no shown) is necessary for improving the heat dissipation efficiency.

In view of the demerits of the conventional lamp, the present invention provides a shell integrated light-emitting diode assembly having benefits of simple design, high yield rate, high heat dissipation efficiency, and high light extraction rate. Further, the present invention can improve the prior drawbacks of brittle structure and non-uniform color temperature at different surfaces, etc.

SUMMARY OF THE INVENTION

For the aforementioned purpose, the present invention provides a shell integrated light-emitting diode (LED) assembly, which is different from the conventional LED encapsulation based on fluorescent composite substrate with an aluminum thermal radiator. The heat generated in the shell integrated LED assembly of the present invention is directly conducted or radiated into an open air from the resin structure of the shell integrated LED assembly. According to the present invention, LED, fluorescent material (for example, fluorescent power), nano thermal conductive particles, and molding material (for example, Epoxy resin) are formed as a consolidation structure (for example, shell structure) of the shell integrated LED assembly by a molding material (for example, Epoxy resin) for enclosing the light-emitting unit to be inside the molding material. The shell structure of the present invention can function as a combination of the conventional lamp housing and the conventional thermal radiator; that is, the shell structure is a simple structure for functioning as the conventional lamp housing and the conventional thermal radiator.

According to the present invention, the shell integrated LED assembly including at least one fluorescent resin substrate (manufactured by composite material), at least two conduction supports, at least one light-emitting unit (for example, LED lighting unit), at least two internal wirings, and a molding material. The fluorescent resin substrate is manufactured by a curing reaction of a mixture. The fluorescent resin substrate is translucent or transparent. Each of the conduction supports partially connects the fluorescent resin substrate. The light-emitting unit is located on a surface of the fluorescent resin substrate, and each of the internal wirings individually connects the light-emitting unit, and the conduction supports are also connected to the light-emitting unit by the internal wirings. The molding material is configured for another curing reaction, and is used to forming a consolidation structure for enclosing the light-emitting unit in the shell integrated LED assembly with the fluorescent composite resin.

In one embodiment, the shell integrated LED assembly is an integration structure of the shell structure with the fluorescent composite resin and a white light-emitting unit, which can overcome the aforementioned drawback of the conventional LED chip encapsulation. Further, the light from the white light-emitting unit can emit in all directions. The shell integrated LED assembly has the benefits of high light flux, high light emitting efficiency, good heat dissipation, simple manufacturing process, high yield rate, and less labor hour needed in the manufacturing process. Besides, the heat is directly radiated into the air outside of the shell structure. The shell structure is formed as a homogeneous fluorescent composite resin structure, such that the shell structure is translucent or transparent, and there is no shadow or dark area on the shell structure when the light-emitting unit emits light. Therefore, the shell structure of the present invention is applicable to a variety of high power or high energy saving bulbs, and is not restrained by any lamp shape due to no lamp housing needed.

In one perspective, the present invention provides a shell integrated LED assembly, which includes: a plurality of light-emitting units, each of the light-emitting units including at least one light-emitting chip and an external wiring which is coupled to the light-emitting chip; and a shell structure, formed as a consolidation structure by a molding material for enclosing the light-emitting unit to be inside the molding material. The light-emitting units emit light through the molding material into an outside of the shell structure.

In one embodiment, the molding material includes a second nano thermal conductive material, wherein the light-emitting units emit light through the molding material into the outside of the shell structure.

In one embodiment, a proportion of the second nano thermal conductive material in the molding material is in a range between 5% and 70%.

In one embodiment, the molding material further includes a second fluorescent thermal conductive material, wherein the light-emitting units emit light through the molding material into the outside of the shell structure.

In one embodiment, the one end of each external wiring is coupled to the light-emitting unit, and another end of external wiring is exposed outside a bottom side of the shell structure.

In one embodiment, the light-emitting chip includes LED lighting unit, and a wave length of the light emitted from the LED lighting unit is lower than 500 nm. The LED lighting unit includes a blue LED grain or a purple LED grain. The light-emitting unit further includes a fluorescent resin substrate, a package unit, and a plurality of internal wirings. The LED lighting unit is located on the fluorescent resin substrate, and the fluorescent resin substrate and the package unit are configured to enclose the LED lighting unit. The package unit includes a solidifying material which includes a first nano thermal conductive material and a first fluorescent material for enclosing a portion of the LED lighting unit, and the fluorescent resin substrate is configured to enclose another portion of the LED lighting unit. The LED lighting unit emits light through the solidifying material and the fluorescent resin substrate into an outside of the light-emitting unit. The internal wirings in the light-emitting unit are configured to couple the LED chips together in said light-emitting unit.

In one embodiment, the first fluorescent material (or the second fluorescent material) includes a yellow fluorescent material and further optionally includes a red fluorescent material, a green fluorescent material, or an orange fluorescent material. Each of the fluorescent materials includes an Aluminate fluorescent material, a Silicate fluorescent material, a Nitride fluorescent material, an Oxynitride fluorescent material, or a combination of the aforementioned fluorescent material in this embodiment.

In one embodiment, the first nano thermal conductive material (or the second nano thermal conductive material) includes a plurality of nano thermal conduction particles, and a scale of the nano thermal conduction particles is less than 50 nm. The nano thermal conduction particles includes a plurality of metal particles, a plurality of metal oxide particles, a plurality of ceramic particles, a plurality of carbon-based particles, or a combination of the aforementioned particles in this embodiment.

In one embodiment, the molding material (or the solidifying material) includes an Epoxy material, a Bisphenol A Epoxy material, a Cycloaliphatic-Epoxy material, a Siloxane modified Epoxy Resin material, an Acrylic modified Epoxy Resin, an Organic modified Epoxy Resin material, a Silicone material, a Silicone Gel material, a Silicone Rubber material, a Silicone Resin material, an Organic modified Silicone Resin, a Sapphire glass or glass filler, or a combination of the aforementioned materials in this embodiment.

In one embodiment, a surface of the shell structure is coated by a Graphene material or a brightness enhancement film. The brightness enhancement film includes UV curable resin, UV curable adhesive or UV hard coating material. It is noted that, during UV coating, a user can perform carving or engraving any designed pattern on the present LED shell structure.

In one perspective, the present invention provides a shell integrated light-emitting diode (LED) lamp, which includes: a shell integrated light-emitting diode (LED) assembly, including a shell structure, which is formed as a consolidation structure by a molding material for enclosing a plurality of light-emitting units to be inside the molding material, wherein each of the light-emitting units includes at least one light-emitting chip and an external wiring which is coupled to the light-emitting chip, and the light-emitting units emit light through the molding material into the outside of the shell structure; and a lamp holder, including a fitting portion and a power connection unit, wherein the fitting portion is configured to operably connect the shell integrated LED assembly with the lamp holder, and the power connection unit is coupled to an external power source.

In one embodiment, the shell integrated LED lamp further includes a driving circuit, which is coupled to the external wirings and configured to receive an external power source to correspondingly generate a driving signal, for controlling the light-emitting unit to emit the light.

In one perspective, the present invention provides a manufacturing method of shell integrated LED lamp, which includes: providing a plurality of light-emitting units, each of the light-emitting units including a light-emitting chip and an external wiring coupled to the light-emitting chip; providing a forming mold, including a cavity corresponding to a shape of the shell structure; disposing the light-emitting units at corresponding positions in the cavity; providing a molding material, including a plurality of nano thermal conduction particles; filling the molding material into the cavity with the light-emitting units, to form a shell structure by the molding material for enclosing the light-emitting unit to be inside the molding material. The light-emitting units emit light through the molding material and the nano thermal conduction particles in the molding material, into an outside of the shell structure.

The shell structure according to the present invention includes the Epoxy resin material, such that the shell structure has the benefits of resistance to acid, alkali, dust, rust, abrasion, press, and water. Furthermore, the light emits directly from the shell structure into the outside of the shell structure, and there is no thermal barrier between the shell structure and the outside, such that the heat dissipation is better than the conventional LED lamp. In the conventional LED lamp, the generated heat together with the light emission is accumulated in the bulb, such that the conventional LED lamp has a worse heat dissipation efficiency than the shell structure of the present invention. Besides, the light-emitting unit of the present invention is integrated in the shell structure, and the bulb is not necessary in the present invention that a cost effective effect is obtained. The fluorescent mixture leaves no shadow or dark area in the shell structure, the color rendering index of light emission by the present invention can be more than 95 in sunlight spectrum.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, or show the interrelations between the components, but not drawn according to actual scale.

Figure 1:
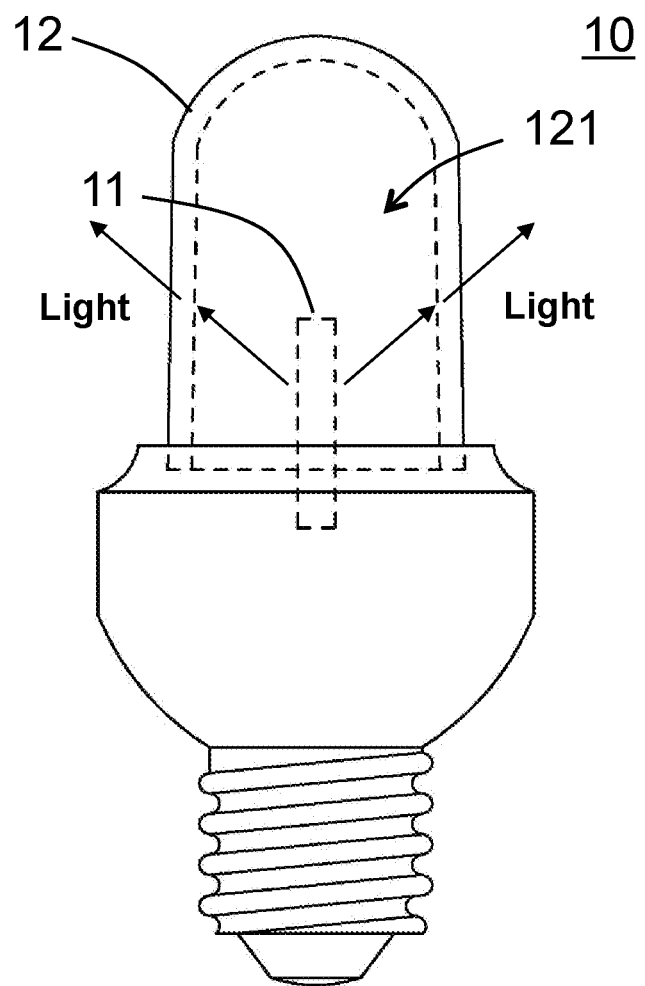
FIG. 1 shows a conventional LED lamp.
Figure 2A:
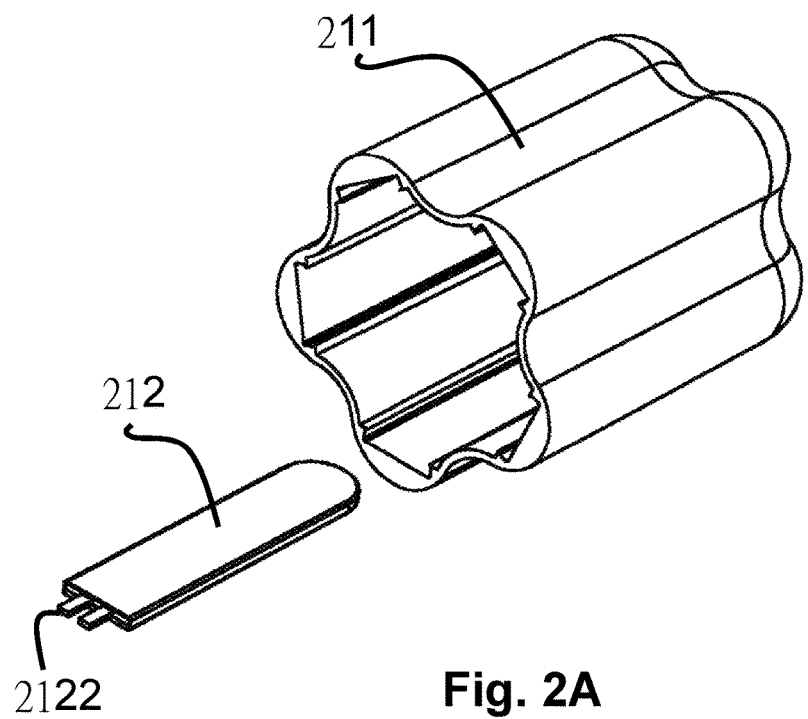
FIGS. 2A-2E show a shell integrated LED assembly according to one embodiment of the present invention.
Figure 2B:
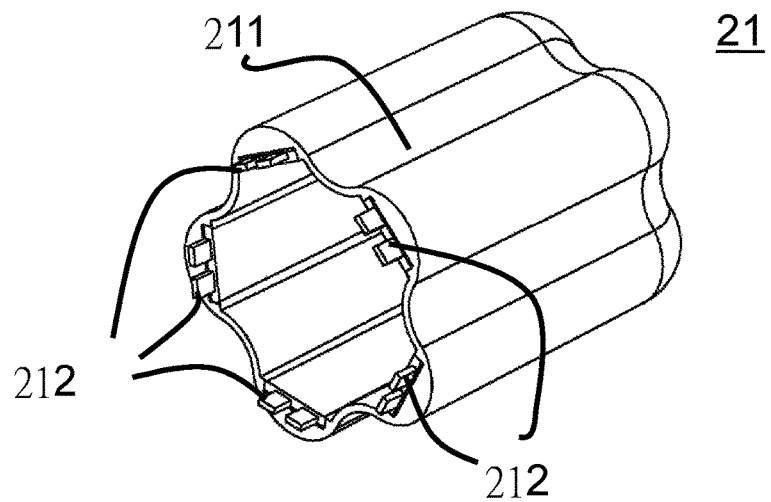
Figure 2C:
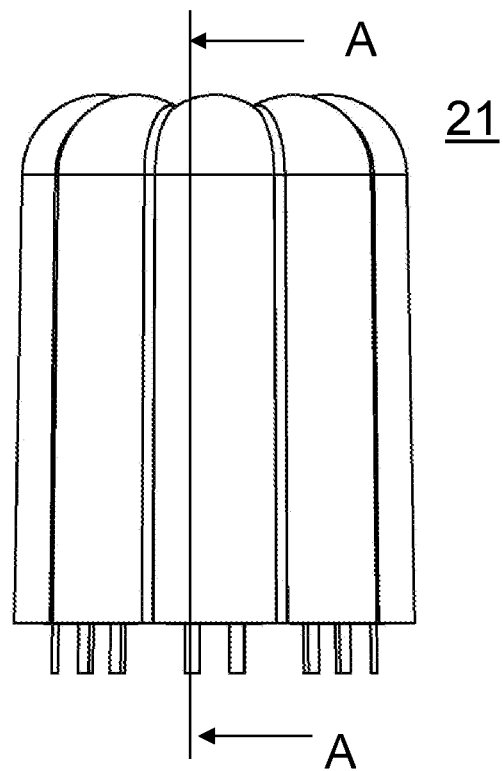
Figure 2D:
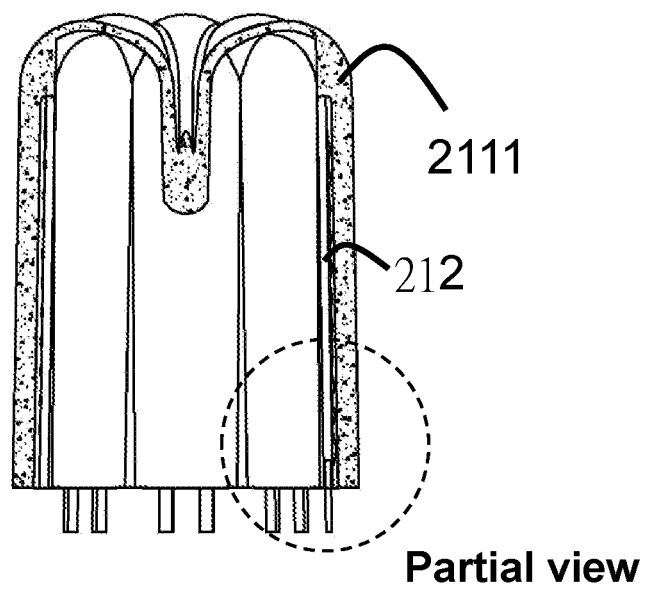
Figure 2E:
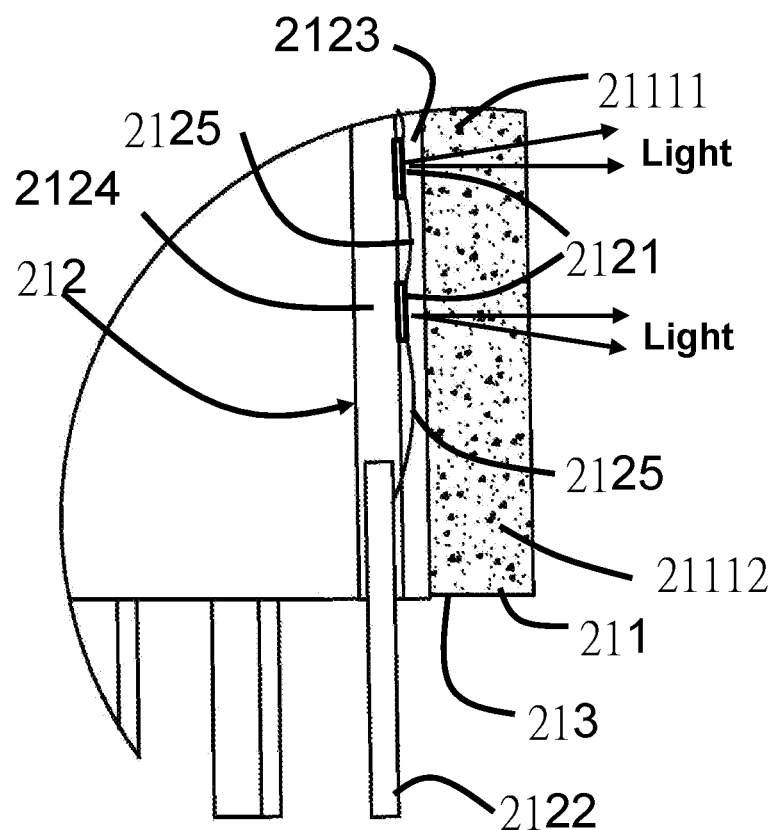

FIGS. 2A and 2B show a shell integrated LED assembly 21 according to one embodiment of the present invention, wherein the light-emitting unit 212 and the shell structure 211 form a consolidation structure. FIG. 2C shows a schematic view of the shell integrated LED assembly 21. FIG. 2D shows a cross-section view according a cutting line AA in FIG. 2C. FIG. 2E shows a partial view according to cross-section view of FIG. 2D. Therefore, FIGS. 2A, 2B, 2C, 2D, and 2E show various perspective views of the shell integrated LED assembly 21 according to one embodiment of the present invention. The shell integrated LED assembly 21 includes: a plurality of light-emitting units 212, each light-emitting unit 212 including at least one light-emitting chip 2121 and an external wiring 2122 coupled to the light-emitting chip 2121 (FIG. 3); and a shell structure 211, formed by a molding material 2111 as a consolidation structure for enclosing the light-emitting units 212 with the light-emitting chip 2121 in the molding material 2111. The light-emitting units 212 emit light through the molding material 2111 into an outside of the shell structure 211 directly. In FIG. 2A, the external wiring 2122 of each light-emitting unit 212 can optionally include two conduction supports (two extrusions as shown in FIG. 2A). Moreover, the detail about the light-emitting unit 212 and the shell integrated LED assembly 21 formed by the shell structure 211 is explained in later text. The heat generated by the light-emitting chip 2121 can be directly conducted and radiated into the air outside or surrounding environment because of a direct contact between the molding material 2111 and a solidifying material 21231 of the light-emitting unit. Therefore, one advantage of the present invention is the heat dissipation efficiency according to the present invention is higher than conventional LED lamp. Besides, by the direct contact between the molding material 2111 and the solidifying material 21231, the shell integrated LED assembly 21 can directly emit light into the outside of the shell integrated LED assembly 21, and the light strength is no more reduced by another conventional lamp housing, such that the light emission strength of the present invention is higher than the conventional LED lamp. The light path from the light-emitting chip 2121 passes only one similar material, which is different from the conventional light path passing through various materials with different refraction indexes. And, the light emission strength according to the present invention is higher than the conventional LED lamp because the light path is shorter than the conventional LED lamp.

FIG. 2E shows one embodiment of the present invention, wherein the molding material 2111 can include a second nano thermal conductive material 21111 for improving a heat dissipation efficiency of the molding material 21111. A proportion of the second nano thermal conductive material in the molding material can be in a range between 5% and 70%. The second nano thermal conductive material includes a plurality of nano thermal conduction particles, whose scale is lower than 50 nm in order to reduce the scattering effect on the light emission. Please refer to table 3 shown in below, wherein the effect of the second nano thermal conductive material 21111 on the light transmission through the shell structure 211 is shown, and the second nano thermal conductive material 21111 is shown as a weight proportion of the second nano thermal conductive material 21111 in the molding material. According to the table, the weight proportion (wt %) of the second nano thermal conductive material 21111 is shown in a range between 0% and 70%, wherein the effect of the second nano thermal conductive material 21111 on the light transmission is obviously limited (for example, reduction from 94.2% to 89.1%). Meanwhile, a thermal conductivity of the shell structure 211 increases a lot (for example, from 0.16 W/mk to 0.57 W/mk). Therefore, the thermal conductivity of the molding material 21111 increases up to four times, and the light transmission decreases roughly 5% (70% of the first nano material in the molding material 2111).

TABLE 1

| | Nano thermal conductive material (wt %) | | | |
|---|---|---|---|---|
| | 0 | 30 | 50 | 70 |
| Light transmission (%) | 94.2 | 91.8 | 90.6 | 89.1 |
| Thermal conductivity (W/mk) | 0.16 | 0.26 | 0.42 | 0.57 |

FIG. 2E shows one embodiment of the present invention, wherein the molding material 2111 further includes a second fluorescent material 21112. The light-emitting chip 2121 emits light through the shell structure 211 into the outside of the shell structure 211, wherein the shell structure 211 is formed by the molding material distributed with the second fluorescent material 21112. The second fluorescent material 21112 can have various material options according to a practical need of the light emission from the light-emitting chip 2121; for example, adjustment on a color rendering property. The fluorescent material can include a red fluorescent material, a green fluorescent material, or an orange fluorescent material. Regarding the material composition, the fluorescent materials includes an Aluminate fluorescent material, a Silicate fluorescent material, a Nitride fluorescent material, an Oxynitride fluorescent material, or a combination of the aforementioned fluorescent material in this embodiment.

Figure 3:
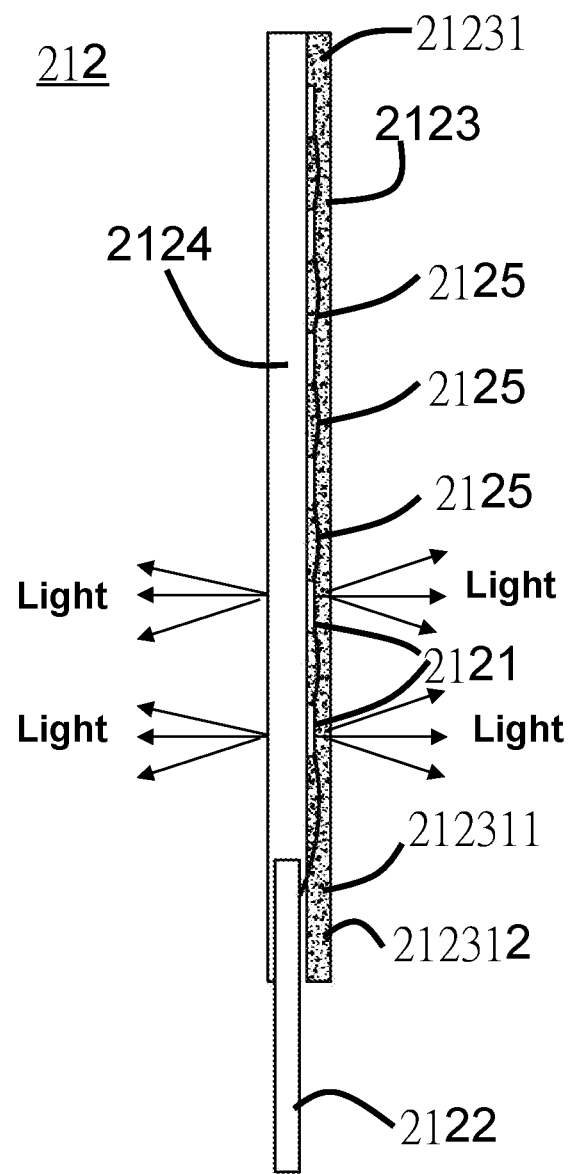
FIG. 3 shows a light emitting unit set in the shell integrated LED assembly according to one embodiment of the present invention.

As shown in FIG. 3, the light-emitting unit 212 can have at least one light-emitting chip 2121, or a plurality of light-emitting chips 2121. The number of the light-emitting chips 2121 shown in the figure is for illustrative purpose only and not for limiting the number of the light-emitting chips 2121 in the light-emitting unit 212. For example, each of the light-emitting unit 212 can have one light-emitting chip 2121, or twenty light-emitting chips 2121. Preferably, the number of the light-emitting chips 2121 in one light-emitting unit 212 is in a range between ten and twenty. In FIG. 3, one end of the external wiring 2122 is coupled to the at least one light-emitting chip 2121, and another end of external wiring 2122 is exposed outside a bottom side 213 of the shell structure 211.

Importantly, the shape design of the shell integrated LED assembly 21 is not limited as shown in figure; further, the shape design can be modified according to practical need of the user. When the shell integrated LED assembly is embodied in the spirit of the present invention, the shape of the shell integrated LED assembly is within the scope of the present invention.

FIG. 3E shows one embodiment of the present invention, wherein the light-emitting chip 2121 is preferably a LED unit in a sheet shape or a white LED unit in a sheet shape. The light-emitting unit 212 further includes a fluorescent resin substrate 2124, a package unit 2123, and a plurality of internal wirings 2125. The light-emitting chip 2121 is located on the fluorescent resin substrate 2124, the LED chip is located on the fluorescent resin substrate 2124. The fluorescent resin substrate 2124 and the package unit 2123 are configured to enclose the light-emitting chip 2121. The package unit 2123 includes a solidifying material 21231 which includes a first nano thermal conductive material 212311 and a first fluorescent material 212312 for enclosing a portion of the LED chip 2121. The LED chip 2121 emits light through the first nano thermal conductive material 212311 and the first fluorescent material 212312 which are included in the solidifying material 21231 (shown in FIG. 3), into the outside of the light-emitting unit 212. The internal wirings 2125 in the light-emitting unit 212 are coupled to the LED chips 2121 in the same light-emitting unit 212. Importantly, the shell integrated LED assembly 21 of the present invention can emit light in all directions; therefore, the molding material 2111 and the solidifying material 21231 must be optionally translucent, transparent, or semi-transparent. For example, the aforementioned first nano thermal conductive material 212311 and the second nano thermal conductive material 21111 can preferably include a transparent organic powder/particle, or transparent inorganic powder/particle. However, according to practical need, the aforementioned first nano thermal conductive material 212311 and the second nano thermal conductive material 21111 can optionally include a metal powder/particle.

As shown in FIGS. 2D and 2E, the light-emitting chip 2121 is integrated in the shell integrated LED assembly 21 as a consolidation structure, such that the shell integrated LED assembly 21 also functions as a bulb. That is, the technique of the present invention can be named as a technique of "chip in lamp" for the light-emitting chip embedded in the lamp.

Figure 4:
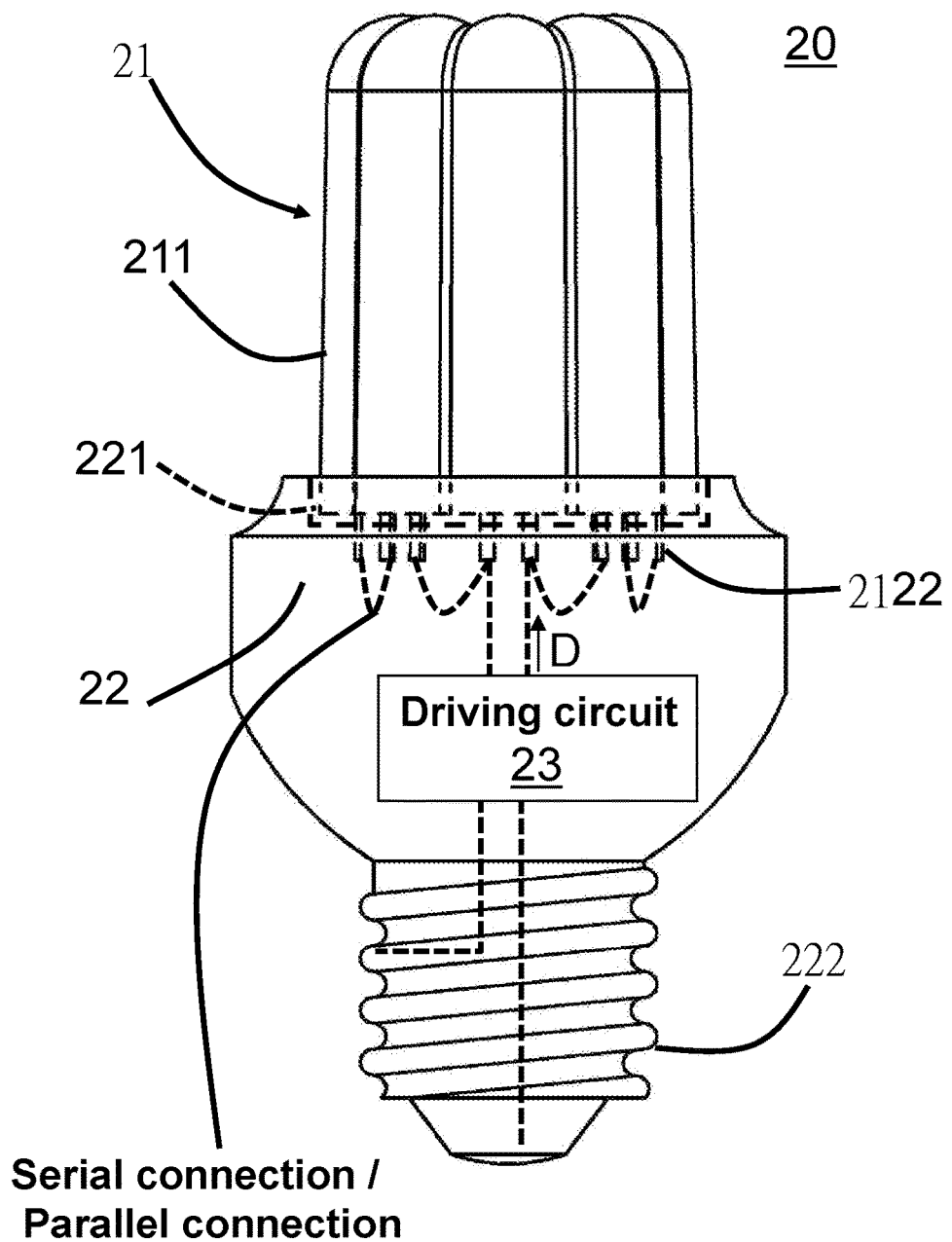
FIG. 4 shows a shell integrated LED lamp with the shell integrated LED assembly according to one embodiment of the present invention.

FIG. 3 shows one embodiment of the present invention, wherein a cross-section view of the light-emitting unit 212 including a plurality of light-emitting chips 212 is shown. When the LED chips 2121 in the same light-emitting unit 212 are coupled in serial connection by the internal wirings 2125, the light-emitting units 212 are coupled in parallel connection by the external wirings 2122 (FIG. 4). Or, when the LED chips 2121 in the same light-emitting unit 212 are coupled in parallel connection by the internal wirings 2125, the light-emitting units 212 are coupled in serial connection by the external wirings 2122 (FIG. 4). In this embodiment, when one of the light-emitting chips 2121 malfunctions, the rest light-emitting chips 2121 in the shell integrated LED assembly 21 can keep operating normally by the aforementioned serial-parallel connection, to provide a stable operation of the shell integrated LED assembly 21.

In one embodiment, similarly to the second fluorescent material, the first fluorescent material 212312 includes a yellow fluorescent material and further optionally includes a red fluorescent material, a green fluorescent material, or an orange fluorescent material. Regarding the material composition, the fluorescent materials includes an Aluminate fluorescent material, a Silicate fluorescent material, a Nitride fluorescent material, an Oxynitride fluorescent material, or a combination thereof. The combination can depend on the color rendering index requirement, or light extraction requirement of the light-emitting chip 2121.

In one embodiment, the first nano thermal conductive material 212311 or the second nano thermal conductive material 21111 includes a plurality of nano thermal conduction particles, and a scale of the nano thermal conduction particles is less than 50 nm. Regarding the material composition, the nano thermal conduction particles includes a plurality of metal particles, a plurality of metal oxide particles, a plurality of ceramic particles, a plurality of carbon-based particles, or a combination thereof. According to the aforementioned description, the shell integrated LED assembly 21 can emit light in all directions; therefore, the thermal conduction particles is preferable translucent or transparent. Further, the scale of the thermal conduction particles is limited for avoiding light shielding effect, because it is possible to reduce the light transmission through the molding material 2111 (or the solidifying material 21231) to lower down the light emission efficiency according to the light-emitting chips 2121. The aforementioned metal particles can include copper particles, silver particles, or aluminum particles. The aforementioned metal oxide particles can include aluminum oxide particles, or zinc oxide particles. The aforementioned ceramic particles can include boron nitride particles, aluminum nitride particles, silicon carbide particles, or nano ceramic particles. The aforementioned carbon-based particles can include graphite particles, carbon fiber particles, or nano carbon particles.

In one embodiment, the molding material 2111 (or the solidifying material 21231) includes an Epoxy material, a Bisphenol A Epoxy material, a Cycloaliphatic-Epoxy material, a Siloxane modified Epoxy Resin material, an Acrylic modified Epoxy Resin, an Organic modified Epoxy Resin material, a Silicone material, a Silicone Gel material, a Silicone Rubber material, a Silicone Resin material, an Organic modified Silicone Resin, a Sapphire glass or glass filler, or a combination of the aforementioned materials in this embodiment.

In the embodiment, a temperature or brightness design of the shell integrated LED assembly 21 and/or the light-emitting unit 212, can be decided according to a resin mixture proportion (for example, mixture percentage), thickness (for example, micrometer μm), and weight proportion (for example, weight percentage) of the thermal conductive material. In one embodiment, a user can decide the temperature or brightness according to two following formulas:

$$(\text{Resin \%} \times \text{Thickness (μm)})/(\text{Thermal conductive material \%}) \propto \text{Temperature}$$

$$(\text{Resin \%})/(\text{Thermal conductive material \%} \times \text{Thickness (μm)}) \propto \text{Brightness}$$

By the same principle, according to the required temperature or brightness, the user can decide resin mixture proportion, thickness, and weight proportion of the thermal conductive material in the shell integrated LED assembly 21 and/or the light-emitting unit 212.

In short, the shell integrated LED assembly 21 does not need any lamp housing such as a conventional lamp housing, and has better light emission efficiency than a conventional lamp. The output brightness lumen/input power watt ratio of the shell integrated LED assembly 21 can be in a range between 1501 m/W and 2001 m/W. For example, when the input power watt is 10 watt, the output bright lumen is 16001 m. In one embodiment, the output brightness/input power ratio can be reach more than 300 lm/W. Further, the present shell integrated LED assembly 21 can emit light in all directions, since the present light-emitting unit 212 can emit light in all directions. On the contrary, light emission direction according to the conventional LED lamp is seriously restrained, because a lot of light emission angles are shielded by a reflection layer or an opaque substrate therein. Furthermore, the heat dissipation of the shell integrated LED assembly 21 and the light-emitting unit 212 can be directly radiated into the outside environment, such that an excellent heat dissipation effect is obtained such that the corresponding life time increases a lot for the present shell integrated LED assembly 21.

In one embodiment, a surface of the shell structure 211 could be coated by a Graphene material (not shown), and the Graphene material can increase the heat dissipation efficiency and light emission efficiency of the shell structure 211. In another embodiment, a surface of the shell structure 211 could also be coated by a brightness enhancement film (not shown), and the brightness enhancement film is preferred UV curable resin, UV curable adhesive or UV hard coating for enhancing hardness, wearability, abrasion resistance, and optical effects of the shell structure 211. In addition, a user can further use a tempered glass or ceramics materials as the molding material for the present shell integrated LED assembly 21, and the tempered glass or ceramics materials are preferred transparent with transmittance larger than 95%.

According to one perspective, as shown in FIGS. 2E and 4, the present invention provides shell integrated LED lamp 20, which includes: a shell integrated LED assembly 21 and a lamp holder 22. As shown in FIGS. 2B, 2D and 2E, the shell integrated LED assembly 21 includes a shell structure 211, which is formed as a consolidation structure by a molding material 2111 for enclosing a plurality of light-emitting units 212 to be inside the molding material 2111, wherein each of the light-emitting units 212 includes at least one light-emitting chip 2121 and an external wiring 2122 which is coupled to the light-emitting chip 2121, and the light-emitting chips 2121 emit light through the molding material 2111 into an outside of the shell structure 211. As shown in FIG. 4, the lamp holder 22 includes a fitting portion 221 and a power connection unit 222. The fitting portion 221 is configured to operably connect the shell integrated LED assembly 21 with the lamp holder 22, and the power connection unit 222 is coupled to an external power source (not shown). In FIG. 4, the power connection unit 222 is shown as a spiral structure, which can meet any conventional lamp holder design. Furthermore, in one embodiment, the power connection unit 222 can also be a plug-in structure. Because the structure of the power connection unit 222 is a conventional technique, the related description is not detailed here.

As shown in FIG. 4, the shell integrated LED lamp 20 further includes a driving circuit 23, which is coupled to the external wirings 2122 (FIG. 2E) and configured to receive an external power source to correspondingly generate a driving signal D, for controlling the light-emitting unit 212 to emit the light.

Figure 5:
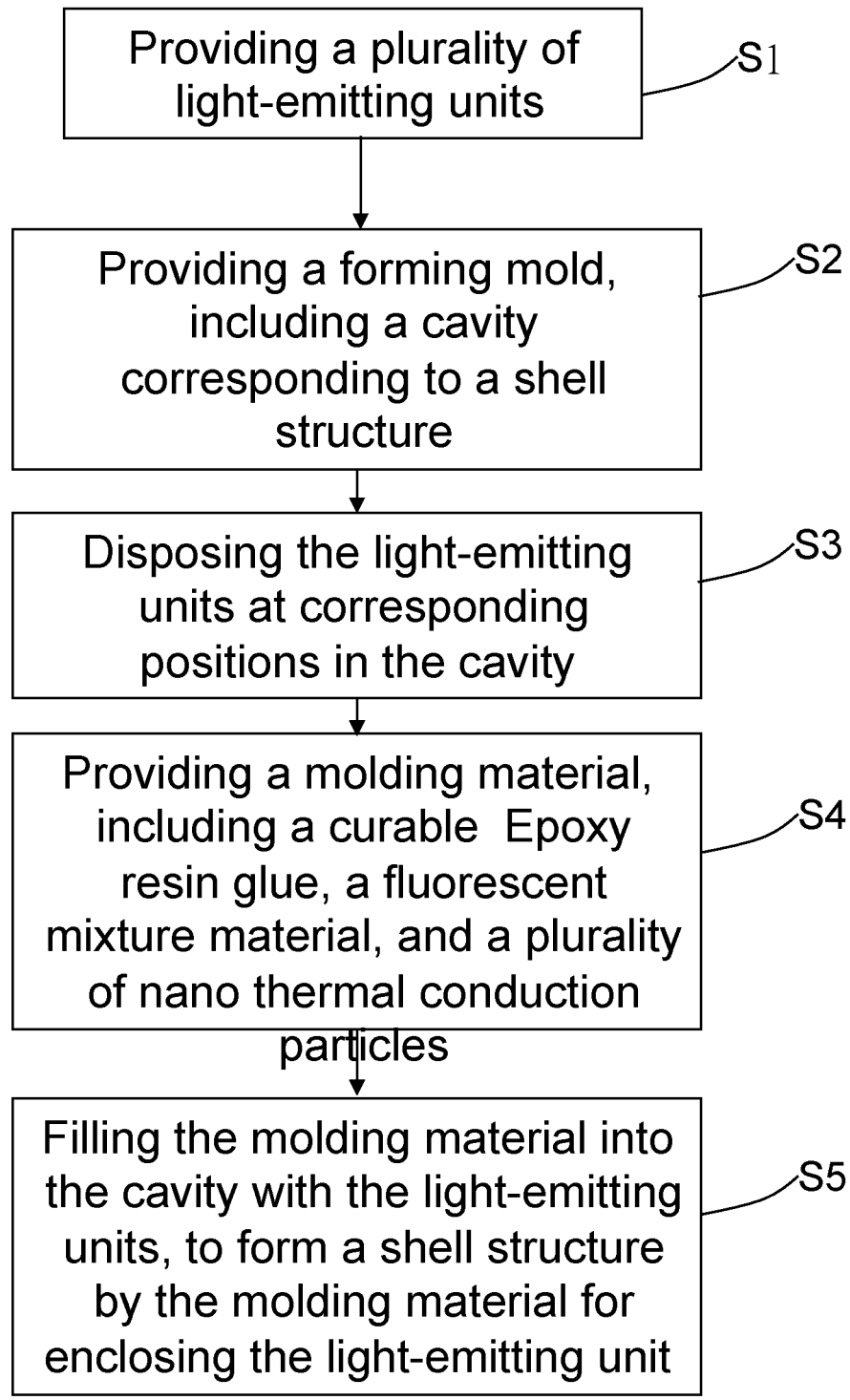
FIG. 5 shows a manufacturing method flowchart of the shell integrated LED assembly according to one embodiment of the present invention.

According to one more perspective, as shown in FIG. 5, the present invention provides a manufacturing method of shell integrated LED lamp. The method includes: providing a plurality of light-emitting units, each of the light-emitting units including a light-emitting chip and an external wiring coupled to the light-emitting chip (step S1); providing a forming mold, including a cavity corresponding to a shape of the shell structure (step S2); disposing the light-emitting units at specific predetermined positions in the cavity (step S3); providing a molding material, including a curable Epoxy resin glue, a fluorescent mixture material, and a plurality of nano thermal conduction particles (step S4); filling the molding material into the cavity with the light-emitting units, to form a shell structure by the molding material for enclosing the light-emitting unit to be inside the molding material (step S5). The light-emitting units emit light through the molding material and the nano thermal conduction particles in the molding material, into the outside of the shell structure. Regarding the detail of the nano thermal conduction particles, please refer to the description of the aforementioned embodiments.

The shell integrated LED assembly of the present invention can emit in all directions and has many benefits such as high light flux, high light emitting efficiency, good heat dissipation, simple manufacturing process, high yield rate, and less labor hour needed in the manufacturing process. Besides, the heat is directly radiated into the air from the shell structure and no lamp housing is needed to cover the shell structure. The shell structure is formed as a homogeneous fluorescent composite resin structure, such that the color temperature of light is uniform and there is no shadow or dark area on the shell structure when the light-emitting unit emits light.

It is noted that the present shell integrated LED assembly of the present invention has no lamp housing structure. That is, the present shell structure can function as a combination of the conventional lamp housing and the conventional LED. The present shell integrated LED assembly can function both as a white LED and lamp housing. In other words, the present shell structure can also functions as a combination of the conventional thermal radiator and the conventional lamp housing. That is, the shell structure can function as a combination of the conventional lamp housing, the conventional LED, and the conventional thermal radiator.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. Besides, an embodiment or a claim of the present invention does not need to attain or include all the objectives, advantages or features described in the above. The abstract and the title are provided for assisting searches and not to be read as limitations to the scope of the present invention.

What is claimed is:

1. A shell integrated light-emitting diode assembly comprising:
   at least one light-emitting unit, including at least one light-emitting chip and an external wiring which is coupled to the light-emitting chip; and
   a shell structure, formed as a consolidation structure by a molding material for enclosing the light-emitting unit to be inside the molding material, wherein the light-emitting unit emits light through the molding material into an outside of the shell structure;
   wherein the light-emitting chip is a LED chip, and the light-emitting unit further includes a fluorescent resin substrate, a package unit, and a plurality of internal wirings, wherein the LED chip is located on the fluorescent resin substrate, and the fluorescent resin substrate and the package unit are configured to enclose the LED chip, wherein the package unit includes a solidifying material which includes a first nano thermal conductive material and a first fluorescent material for enclosing a portion of the LED chip, and the fluorescent resin substrate is configured to enclose another portion of the LED chip, and the LED chip emits light through the solidifying material and the fluorescent resin substrate into an outside of the light-emitting unit, and the internal wirings in the light-emitting unit are coupled to the LED chips in said light-emitting unit.

2. The shell integrated light-emitting diode assembly of claim 1, wherein one of the light-emitting units include a plurality of LED chips, and when the LED chips in same light-emitting unit are coupled in serial connection by the internal wirings, the light-emitting units are coupled in parallel connection by the external wirings; or when the LED chips in the same light-emitting unit are coupled in parallel connection by the internal wirings, the light-emitting units are coupled in serial connection by the external wirings.

3. The shell integrated light-emitting diode assembly of claim 1, wherein the molding material includes a second nano thermal conductive material, wherein the light-emitting units emit light through the molding material into an outside of the shell structure.

4. The shell integrated light-emitting diode assembly of claim 3, wherein a proportion of the second nano thermal conductive material in the molding material is in a range between 5% and 70%.

5. The shell integrated light-emitting diode assembly of claim 3, wherein the molding material further includes a second fluorescent thermal conductive material, wherein the light-emitting units emit light through the molding material into an outside of the shell structure.

6. The shell integrated light-emitting diode assembly of claim 3, wherein the second nano thermal conductive material includes a plurality of nano thermal conduction particles, and a scale of the nano thermal conduction particles is less than 50 nm, wherein the nano thermal conduction particles includes a plurality of metal particles, a plurality of metal oxide particles, a plurality of ceramic particles, a plurality of carbon-based particles, or a combination thereof.

7. The shell integrated light-emitting diode assembly of claim 3, wherein the second fluorescent material includes a yellow fluorescent material and further optionally includes a red fluorescent material, a green fluorescent material, or an orange fluorescent material, wherein each of the fluorescent materials includes an Aluminate fluorescent material, a Silicate fluorescent material, a Nitride fluorescent material, an Oxynitride fluorescent material, or a combination thereof.

8. The shell integrated light-emitting diode assembly of claim 1, wherein one end of the external wiring is coupled to the light-emitting unit and another end of external wiring is exposed outside a bottom side of the shell structure.

9. The shell integrated light-emitting diode assembly of claim 1, wherein the first nano thermal conductive material includes a plurality of nano thermal conduction particles, and a scale of the nano thermal conduction particles is less than 50 nm, wherein the nano thermal conduction particles includes a plurality of metal particles, a plurality of metal oxide particles, a plurality of ceramic particles, a plurality of carbon-based particles, or a combination thereof.

10. The shell integrated light-emitting diode assembly of claim 1, wherein the first fluorescent material includes a yellow fluorescent material and further optionally includes a red fluorescent material, a green fluorescent material, or an orange fluorescent material, wherein each of the fluorescent materials includes an Aluminate fluorescent material, a Silicate fluorescent material, a Nitride fluorescent material, an Oxynitride fluorescent material, or a combination thereof.

11. The shell integrated light-emitting diode assembly of claim 1, wherein the molding material includes an Epoxy material, a Bisphenol A Epoxy material, a Cycloaliphatic-Epoxy material, a Siloxane modified Epoxy Resin material, an Acrylic modified Epoxy Resin, an Organic modified Epoxy Resin material, a Silicone material, a Silicone Gel material, a Silicone Rubber material, a Silicone Resin material, an Organic modified Silicone Resin, a Sapphire glass or glass filler, or a combination thereof.

12. The shell integrated light-emitting diode assembly of claim 1, wherein the solidifying material includes an Epoxy material, a Bisphenol A Epoxy material, a Cycloaliphatic-Epoxy material, a Siloxane modified Epoxy Resin material, an Acrylic modified Epoxy Resin, an Organic modified Epoxy Resin material, a Silicone material, a Silicone Gel material, a Silicone Rubber material, a Silicone Resin material, an Organic modified Silicone Resin, a Sapphire glass or glass filler, or a combination thereof.

13. The shell integrated light-emitting diode assembly of claim 1, wherein a surface of the shell structure is coated by a Graphene material or a brightness enhancement film.

14. The shell integrated light-emitting diode assembly of claim 13, wherein the brightness enhancement film includes UV curable resin, UV curable adhesive or UV hard coating.

15. A shell integrated light-emitting diode lamp with the shell integrated light-emitting diode assembly of claim 1, comprising:
the shell integrated light-emitting diode assembly, including the shell structure, which is formed as the consolidation structure by the molding material for enclosing the light-emitting units to be inside the molding material, wherein each of the light-emitting units includes at least one light-emitting chip and the external wiring which is coupled to the light-emitting chip, and the light-emitting units emit light through the molding material into the outside of the shell structure; and
a lamp holder, including a fitting portion and a power connection unit, wherein the fitting portion is configured to operably connect the shell integrated light-emitting diode assembly with the lamp holder, and the power connection unit is coupled to an external power source.

16. The shell integrated light-emitting diode lamp of claim 15, wherein the molding material includes a nano thermal conductive material, wherein the light-emitting units emit light through the molding material into an outside of the shell structure, and the nano thermal conductive material includes a plurality of nano thermal conduction particles, and a scale of the nano thermal conduction particles is less than 50 nm, wherein the nano thermal conduction particles includes a plurality of metal particles, a plurality of metal oxide particles, a plurality of ceramic particles, a plurality of carbon-based particles, or a combination thereof.

17. The shell integrated light-emitting diode lamp of claim 15, wherein the molding material includes an Epoxy material, a Bisphenol A Epoxy material, a Cycloaliphatic-Epoxy material, a Siloxane modified Epoxy Resin material, an Acrylic modified Epoxy Resin, an Organic modified Epoxy Resin material, a Silicone material, a Silicone Gel material, a Silicone Rubber material, a Silicone Resin material, an Organic modified Silicone Resin, a Sapphire glass or glass filler, or a combination thereof.

18. The shell integrated light-emitting diode lamp of claim 15, wherein the light-emitting unit includes a plurality of light-emitting chips which are LED chips, and when the LED chips in the same light-emitting unit are coupled in serial connection by the internal wirings, the light-emitting units are coupled in parallel connection by the external wirings; or when the LED chips in the same light-emitting unit are coupled in parallel connection by the internal wirings, the light-emitting units are coupled in serial connection by the external wirings.

19. The shell integrated light-emitting diode lamp of claim 15, wherein a surface of the shell structure is coated by a Graphene material or a brightness enhancement film, wherein the brightness enhancement film includes UV curable resin, UV curable adhesive or UV hard coating.

* * * * *